(12) United States Patent
Ohtsuka et al.

(10) Patent No.: US 9,977,069 B2
(45) Date of Patent: *May 22, 2018

(54) NON-CONTACT DISCHARGE TEST METHOD AND DEVICE

(71) Applicant: KYUSHU INSTITUTE OF TECHNOLOGY, Fukuoka (JP)

(72) Inventors: Shinya Ohtsuka, Fukuoka (JP); Yuki Yamaguchi, Fukuoka (JP); Hiroyuki Tsubata, Tokyo (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 234 days.

This patent is subject to a terminal disclaimer.

(21) Appl. No.: 14/760,835

(22) PCT Filed: Dec. 12, 2013

(86) PCT No.: PCT/JP2013/083320
§ 371 (c)(1),
(2) Date: Jul. 14, 2015

(87) PCT Pub. No.: WO2014/112257
PCT Pub. Date: Jul. 24, 2014

(65) Prior Publication Data
US 2016/0018459 A1 Jan. 21, 2016

(30) Foreign Application Priority Data
Jan. 15, 2013 (JP) ................. 2013-004497

(51) Int. Cl.
*G01R 31/12* (2006.01)
*G01R 31/02* (2006.01)
*G01R 31/00* (2006.01)

(52) U.S. Cl.
CPC ....... *G01R 31/1218* (2013.01); *G01R 31/025* (2013.01); *G01R 31/008* (2013.01)

(58) Field of Classification Search
CPC .............. G01R 31/1218; G01R 31/025; G01R 31/008; G01R 31/1227; G01J 3/443
See application file for complete search history.

(56) References Cited

U.S. PATENT DOCUMENTS

| 2007/0258090 A1* | 11/2007 | Kwon | ..................... G01J 3/443 356/328 |
| 2009/0015814 A1* | 1/2009 | Mueller | .............. G03F 7/70558 355/68 |
| 2012/0194168 A1 | 8/2012 | Yamaguchi et al. | |

FOREIGN PATENT DOCUMENTS

| CA | 2 762 141 A1 | 7/2012 |
| EP | 2 482 087 A1 | 8/2012 |

(Continued)

OTHER PUBLICATIONS

Bendjamin et al. "Remote Sensing of ESD through Optical and Magnetic Radiation Fields" IEEE Transactions on Dielectrics and Electrical Insulation vol. 6 No. 6, Dec. 1999.*

(Continued)

*Primary Examiner* — Dominic J Bologna
(74) *Attorney, Agent, or Firm* — McGlew and Tuttle, P.C.

(57) ABSTRACT

In a non-contact discharge test performed in a poor electromagnetic noise environment, the energy of discharge is evaluated by detecting weak light emission and processing the intensity waveform of light emission of the discharge. A database is created by measuring the intensity waveform of light emission of discharge generated as a result of application of a voltage or current to a measurement object through use of a light emission measuring device, simultaneously measuring the current waveform of the discharge through use of a current measuring device, and storing in the database the relation between analysis data sets obtained through analysis of the waveforms on the basis of information of the voltage or current applied to the measurement (Continued)

object. The intensity waveform of the light emission of the discharge or spark generated from the measurement object is measured while an electromagnetic wave generated as a result of the discharge of the measurement object is used as a reference. The magnitude of the discharge is estimated as a value by comparing light emission data obtained through analysis of the intensity waveform with the data recorded in the database.

12 Claims, 8 Drawing Sheets

(56) References Cited

FOREIGN PATENT DOCUMENTS

| | | |
|---|---|---|
| JP | 63-086592 A | 4/1988 |
| JP | 05-86841 A | 4/1993 |
| JP | 2006-38471 A | 2/2006 |
| JP | 2009-300357 A | 12/2009 |
| JP | 2010-101671 A | 5/2010 |
| JP | 2012-154880 A | 8/2012 |
| JP | 2012-242307 A | 12/2012 |

OTHER PUBLICATIONS

English Machine translation of Kimura et al. (JP 2006/038471) Feb. 9, 2006.*
English machine translation of Otsuka et al. (JP 2009/300357) Jun. 17, 2008.*

* cited by examiner

RELATION BETWEEN DISCHARGE LIGHT EMISSION
INTENSITY AND DISCHARGE CURRENT

RELATION BETWEEN DISCHARGE LIGHT EMISSION
INTEGRAL VALUE AND DISCHARGE CHARGE AMOUNT

LIGHTNING RESISTANCE TEST DEVICE

NON-CONTACT DISCHARGE TEST METHOD AND DEVICE

This application claims the benefit of PCT International Application Number PCT/JP2013/083320 filed Dec. 12, 2013 and Japanese Application No. 2013-004497 filed, Jan. 15, 2013 in Japan, the disclosures of which are incorporated herein by reference.

TECHNICAL FIELD

The present invention relates to a non-contact discharge test method and a non-contact discharge test device which evaluate, in a non-contact state, discharge or spark of a measurement object by optically measuring a phenomenon of light emission due to the discharge or spark.

BACKGROUND ART

In the case of a new aircraft in which CFRP (carbon fiber reinforced plastic) is used for the main wings and/or airframe structure, if a main wing is struck by lightning, discharge (=voltage spark) or spark (=thermal spark or arc) may be generated at a fastener (a fastening bolt made of metal) attached to the main wing of CFRP. In such a case, there arises a possibility that fuel stored in the wing catches fire and explodes. Therefore, restraint of generation of such discharge has become important. It is said that if discharge energy exceeds 200 µJ (threshold), catching fire occurs (there is a standard on this).

Such a new material requires a test for evaluating the effectiveness and soundness of developed techniques. A lightning resistance test is one such test. In a lightning resistance test for aircraft, evaluation is made as to whether or not discharge or spark is generated upon application of lightning impulse current. In this test, a large current which has a waveform imitating that of a lightning stroke and whose peak is several 10s of kA to 200 kA is applied to a sample.

Conventionally (according to the standard), an image of emitted light is captured by a film camera, and evaluation is made as to whether or not light emission is recorded on a film when the input energy is 200 µJ. Therefore, it has been necessary to install a camera at a location where the entirety of an object to be observed can be seen and to install a plurality of cameras so as to perform evaluation at a plurality of locations. Accordingly, it has been difficult to secure a location (s) where a camera or a plurality of cameras are installed. Although the ISO sensitivity of film and the F value of lens are designated, the conventional method has problems; for example, quantitative evaluation of the energy of emitted light is theoretically difficult. In the case where a camera cannot be installed, a gas mixture containing hydrogen gas is charged into a measurement object and an explosion test is carried out. However, this method has a problem of unable to identify the location of any explosion.

Therefore, there has been demanded development of a light, emission detection technique which determines, in the lightning resistance test for aircraft, whether or not discharge or spark is present and determines the energy of the discharge or spark if any. Patent Document 1 discloses a technique of detecting light emitted as a result of partial discharge within gas insulation equipment through use of a light emission detector (a light-receiving element) and evaluating the detected light although the technique is not for the lightning resistance test of aircrafts. For the light emission detector, there is used a light-receiving element whose detection sensitivity is high for the light, emitted as a result of partial discharge (in particular, a wavelength range of 300 nm to 600 nm) for example, a photomultiplier tube (PMT) or a photodiode of high sensitivity. The output of the light-receiving element is observed through use of a measuring device for example, a waveform observing device such as an oscilloscope).

In such a lightning resistance test, discharge or spark from a sample (in the case of a sample with a fastener F, discharge or spark from the vicinity of the fastener) is measured. For the measurement, unlike the case where light emitted as a result of partial discharge within gas insulation equipment is detected, a large current which has a waveform imitating that of a lightning stroke and whose peak is several 10s of kA to 200 kA is applied to a sample. Therefore, the lightning resistance test must be carried out in a poor electromagnetic noise environment.

PRIOR ART DOCUMENT

Patent Document
Patent Document 1: Japanese Patent Application Laid-Open (kokai) No. 2010-101671

SUMMARY OF THE INVENTION

Problems to be Solved by the Invention

When the determination as to whether or not discharge or spark is present and the evaluation of the energy of the discharge or spark (if any) are performed through use of a light emission measuring device in a non-contact discharge test (e.g., a lightning resistance test for aircraft), synchronous measurement must be performed through use of a plurality of measuring devices which are spaced apart from one another and are shielded. Therefore, means for realizing such synchronous measurement has been demanded.

An object of the present invention, which solves the above-described problem, is to evaluate or determine, in a non-contact discharge test performed in a poor electromagnet noise environment, the energy of discharge or spark by detecting weak light emission and processing the intensity waveform of light emission of the discharge or spark.

Means for Solving the Problems

A non-contact discharge test method of the present invention evaluates, in a non-contact manner, discharge or spark of a measurement object by optically measuring a light emission phenomenon occurring as a result of the discharge or spark. A database is created by applying or supplying a voltage or current from a known power source to the measurement object such that light emission of discharge or spark occurs, measuring an intensity waveform which represents the intensity of the light emission through use of a light emission measuring device and simultaneously measuring the current waveform of the discharge or spark through use of a current measuring device, and storing in the database the relation between analysis data sets obtained through analysis of the waveforms on the basis of information of the voltage or current of the power source applied or supplied to the measurement object. An electromagnetic, wave generated as a result of the discharge or spark of the measurement object is detected, and the intensity waveform of the light emission of the discharge or spark generated from the measurement object is measured by using the same light emission measuring device or a light emission measuring device of the same type as the light emission measuring device, while the electromagnetic wave is used as a timing reference for the generation of the discharge or spark. Light emission data obtained through analysis of the measured intensity waveform of the light emission of the discharge or spark is compared with the data recorded in the database so as to estimate the magnitude of the discharge or spark as a value. Each of the light emission measuring device and the current measuring device is disposed in a shielded condition.

A non-contact discharge test device of the present invention includes a database, an antenna, a waveform intensity obtaining device, a waveform analyzing section, a comparison section, and a display section. The database is created by applying or supplying a voltage or current from a known power source to the measurement object such that light emission of discharge or spark occurs, measuring an intensity waveform which represents the intensity of the light emission through use of a shielded light emission measuring device and simultaneously measuring the current waveform of the discharge or spark through use of a shielded current measuring device, and recording the relation between analysis data sets obtained through analysis of the waveforms in the database on the basis of information of the voltage or current of the power source applied or supplied to the measurement object. The antenna detects an electromagnetic wave generated as a result of the discharge or spark of the measurement object. The waveform intensity obtaining device measures the intensity waveform of the light emission of the discharge or spark generated from the measurement object and obtains the waveform intensity of the intensity waveform. The waveform intensity obtaining device measures the intensity waveform by using the same light emission measuring device or a light emission measuring device of the same type as the light emission measuring device, while using the electromagnetic wave as a timing reference for the generation of the discharge or spark. The waveform analyzing section analyzes the waveform intensity obtained by the waveform intensity obtaining device. The comparison section compares light emission data obtained as a result of the analysis by the waveform analyzing section with the data recorded in the database to thereby estimate the magnitude of the discharge or spark as a value. The display section displays the estimated magnitude of the discharge or spark.

It is possible to perform a lightning resistance test in which an impulse power source is used as the known power source so as to cause the light emission of the discharge or spark, and the information of the voltage or current of the power source is detected through use of a voltage or current detector.

The magnitude of the discharge or spark is the peak value of current of the discharge or spark, a charge amount which is the integral value of the current of the discharge or spark, or the energy of the discharge or spark. The magnitude of the discharge or spark is evaluated on the basis of the peak value or area of the measured light intensity waveform. The light emission measuring device may be disposed to face the measurement object through an optical guide.

Effects of the Invention

According to the present invention, for example, in a lightning resistance test for aircraft, a non-contact discharge test can be performed in a poor electromagnetic noise environment by detecting weak light emission and processing the intensity waveform of light emission of discharge or spark. As a result, the technique of detecting the discharge-or-spark induced light emission and evaluating its energy can be applied to an actual lightning resistance test for aircraft. Further, in addition to the image of emitted light and the light emission, an electromagnetic wave signal is obtained. Therefore, it is possible to instantaneously evaluate the time, location, and the magnitude of discharge (spark) without waiting for development of film or the like.

BRIEF DESCRIPTION OF DRAWINGS

FIGS. 5(A) and 5(B) are a pair of graphs showing an example of the characteristic when an optical waveguide (optical fiber) is used wherein FIG. 5(A) shows the relation between discharge light emission intensity and discharge current, and FIG. 5(B) shows the relation between discharge light emission integral value and discharge charge amount.

MODE FOR CARRYING OUT THE INVENTION

The present invention will now be described by way of examples. In the present invention, first, for each light emission measuring device to be used, a database which represents the correlation between optical signals (at least the peak value Lp of light intensity waveform and the area Lq of light intensity waveform) and the magnitude of discharge (the amount q of discharge charge, the peak value ip of discharge current, and the energy E of discharge) is created in consideration of applied power supply information (at least the magnitude and polarity of applied voltage, the instantaneous voltage at the time when discharge light emission is generated, and the generation time (or phase)). In the present invention, the data recorded in the created database is used in a situation in which the current waveform of discharge or spark cannot be measured; for example, in a lightning resistance test. In such a situation, the waveform of light emission intensity is measured, and the integral value (the amount of charge) of current of the discharge or spark or the amount of energy (the product of the integral value and the voltage) is obtained on the basis of the data recorded in the database.

Figure 1:
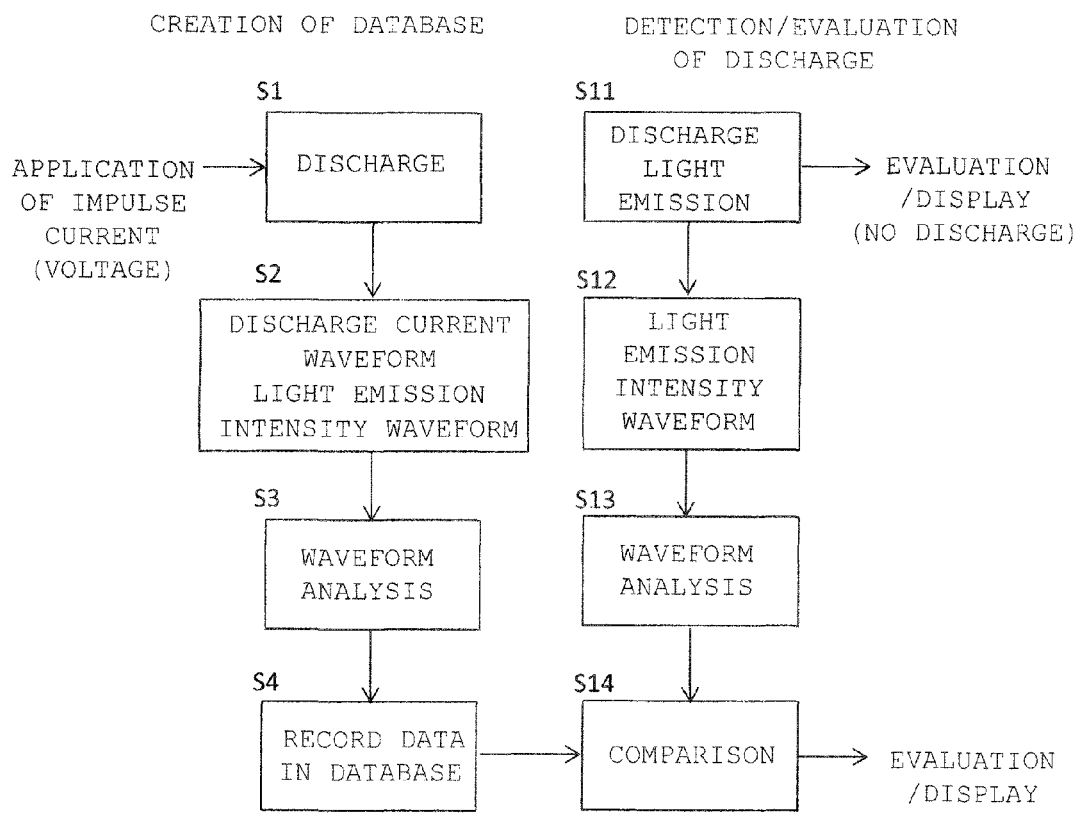
FIG. 1 is an operational diagram used for explaining a non-contact discharge test method according to the present invention.

FIG. 1 is an operational diagram used for explaining a non-contact discharge test method according to the present invention. First, a database is created by recording data from a plurality of reference electrical discharges. Specifically, in step S1, a lightning impulse voltage is applied to a discharge source for test from a power source whose power source information is known, whereby discharge light emission occurs. In the lightning resistance test (lightning stroke test), the power source which applies a lightning impulse current is composed of a current source LI_CG and a current detector CT which detects the current. In the case of an impulse power source, its polarity is known. However, it is necessary to know the timing at which discharge or spark has been generated. Further, in the present invention, not only the impulse power source, but also other various types of power sources such as AC and DC power sources can be used. In this case, the current detector CT or a voltage detector measures power source information, including voltage, current, and polarity.

In step S2, the intensity waveform of the discharge light emission is measured through use of a light emission measuring device. Simultaneously, the waveform of the discharge current is measured through use of a current conversion probe CT, a current waveform detector, or the like which has a frequency response up to several GHz.

In step S3, these waveforms are analyzed. In step S4, for each light emission measuring device to be used and each discharge environment of interest, the relation between the peak value Lp of the light intensity waveform and the area (integral value) Lq of the light intensity waveform of the analysis data and the magnitude of discharge (the peak value ip of discharge current, the amount q of discharge charge, or the energy E of discharge) is created in consideration of the applied power supply information, and the created relation is recorded in the database.

Next, through use of the data recorded in the database, the magnitude of a test discharge (the peak value of discharge current, the amount of discharge charge, and the energy of discharge) are determined (evaluated) on the basis of the data of the measured light emission, and their values are estimated. Specifically, in step S11, discharge light emission from a discharge source in a test such as a lightning resistance test (lightning stroke test) is detected. When no discharge has been generated, evaluation is not performed, and the fact that no discharge has been generated is displayed. The present invention is used for a lightning resistance test for aircraft. However, the application of the present invention is not limited thereto, and the present invention can be used for performing a discharge test or monitoring of electrical insulation anomaly for power equipment, electric or electronic equipment, or electric energy equipment electrically driven and controlled, such as electric vehicles. In steps S12 and S13, the intensity waveform of the test discharge light emission is measured through use of a light emission measuring device which is identical to or is of the same type as the light emission measuring device used for creation of the database, and the waveform is analyzed. In step S14, the light emission data obtained as a result of the analysis is compared with the data recorded in the database so as to estimate the peak value ip of discharge current, the amount q of discharge charge, which is the integral value of discharge current, and the energy E of discharge.

Figure 2:
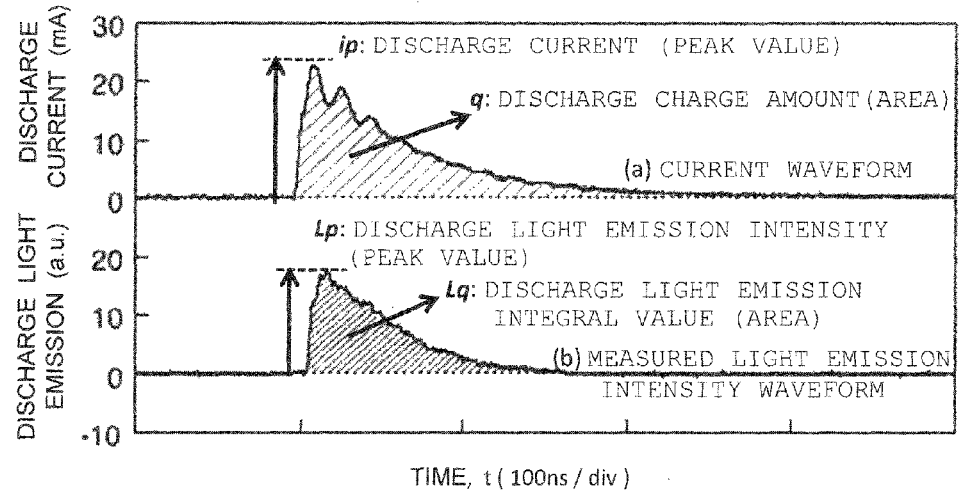
FIG. 2 is a graph used for explaining the definition of waveforms.

FIG. 2 is a graph used for describing the definition of waveforms. The horizontal axis shows time. The discharge current waveform is shown on the upper side of FIG. 2, and the intensity waveform of the discharge light emission measured simultaneously is shown on the lower side of FIG. 2. In the present invention, the discharge current is evaluated from the measured discharge light emission intensity through use of the data recorded in the database. Specifically, the peak value ip of discharge current is evaluated on the basis of the peak value Lp of the light intensity waveform. Alternatively, the peak value ip of discharge current may be evaluated on the basis of the area Lq of the light intensity waveform. The charge amount q which is the integral value of discharge current is evaluated on the basis of the area (integral value) Lq of the light intensity waveform. Alternatively, the charge amount q may be evaluated on the basis of the light intensity peak value Lp. The energy E of discharge is evaluated on the basis of the area (integral value) Lq of the light intensity waveform or the light intensity peak value Lp. The details of the evaluation will be described later.

Figure 3:
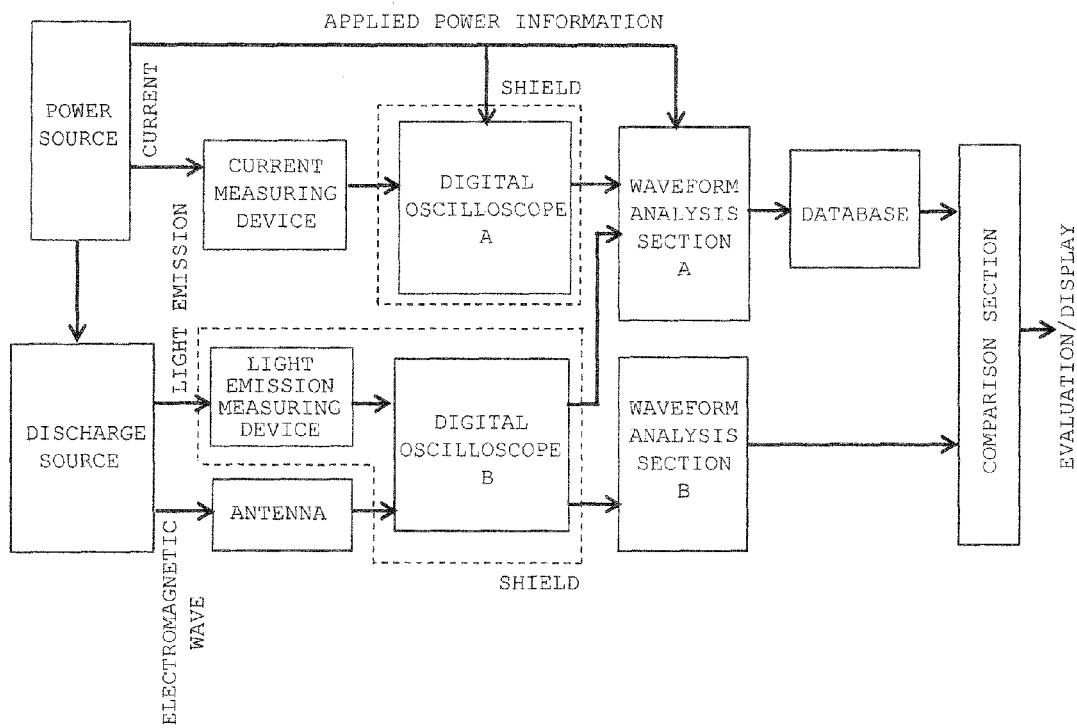
FIG. 3 is a circuit diagram of a non-contact discharge test device configured on the basis of the present invention.

FIG. 3 is a circuit diagram of a non-contact discharge test device configured on the basis of the present invention. As described above, when a database is created, a current (voltage) is applied to a discharge source for test from a power source whose power source information is known. Depending on the type of a discharge test to be carried out, instead of lightning impulse current, AC or DC test voltage can be used. In ether case, the applied voltage, the polarity of the applied voltage, the instantaneous voltage at the time when discharge is generated, and the generation time (or phase) are known. The discharge current is measured through use or a current measuring device. However, at the time of discharge tests and maintenance operation performed after creation of the database, the discharge current is not measured, and only the measurement of the light emission intensity waveform by the light emission measuring device and the measurement of the discharge timing through use of an antenna are carried out.

When the database is created, the waveform of the discharge current measured by the current measuring device is observed by a waveform obtaining device such as a digital oscilloscope A. In addition, data of the discharge current are obtained. The frequency band and sampling frequency of the digital oscilloscope must sufficiently cope with changes in the light emission intensity waveform. For example, it is desired that the upper limit of the frequency band is 300 MHz or higher, and the sampling frequency is 1 GS/s or higher. The digital oscilloscope A used for creation of the database is triggered through use of the waveform of the discharge current or the light emission intensity, or a drive control signal of the applied power source, or the waveform of the power source. In an electrostatic discharge test or a lightning impulse test, a test is performed through application of a single voltage pulse or a single current pulse. Therefore, a drive signal or output signal of a testing device (for example, an ESD gun in the case of the electrostatic discharge test or a lightning impulse voltage/current generator in the case of the lightning impulse test) can be used as a trigger signal.

A digital oscilloscope B used when the discharge light emission is evaluated is triggered as follows. An electromagnetic wave radiated as a result of generation of discharge is detected by an antenna, and the detected electromagnetic wave is used as a trigger signal for triggering the digital oscilloscope B. Further, in an AC or DC test or the above-described lightning impulse test, observation may be performed at a specific time (or at a specific phase when an AC signal is used). In such a case, a delay circuit or a pulse generator which produces a trigger signal at that time or phase may be used.

The distal end of an optical guide connected to the light emission measuring device for detecting discharge light emission is disposed to face a measurement object. The obtainment of the current waveform of the discharge current detected by the current measuring device and the obtainment of the light emission intensity waveform of the discharge light emission detected by the light emission measuring device are performed by the digital oscilloscope A and the digital oscilloscope B, which may be disposed at different locations. The digital oscilloscope A is disposed within a shield box for shielding, and the digital oscilloscope B and the light emission measuring device are disposed within another shield box for shielding.

In general, a location where the measurement for creation of the database is performed is not the same as a location where the measurement for evaluation of the discharge light emission of the measurement object (lightning resistance test). Whereas the database can be created through use of a relatively small power source apparatus, the lightning resistance test requires a relatively large power source apparatus. Therefore, when the database is created, the information of the power source (in general, the waveform of the applied voltage), the current of discharge or spark, and light emission can be measured simultaneously a single measuring device without being greatly affected by noise. Namely, in FIG. 3, a single waveform measuring device (digital oscilloscope) is functionally divided into the digital oscilloscope A and the digital oscilloscope B. However, when the database is created, both the information of the power source and the magnitude of the discharge or spark can be obtained through use of the single waveform measuring device (digital oscilloscope). In contrast, in the lightning resistance test, it is common that the current waveform of discharge or spark cannot be measured because of physical arrangement, safety, and electromagnetic noise. Therefore, in the lightning resistance test, the magnitude of the discharge or spark is obtained through use of the database created in advance. Specifically, an electromagnetic wave signal produced as a result of generation of discharge or spark is obtained, and light emission measurement is performed while the synchronism with the power source information is established on the basis of the electromagnetic wave signal, whereby the magnitude of the discharge or spark is obtained.

When the database is created or when the discharge light emission of the measurement object is evaluated, the generated light emission is detected through use of the same light emission measuring device or a light emission measuring device of the same type (i.e., a light emission measuring device having the same characteristic). In accordance with the light emission intensity, the optical signal input to the light emission measuring device is weakened or its sensitivity is increased. The sensitivity can be increased or decreased by increasing or decreasing the distance between the light emission measuring device and the light emission source, disposing an optical filter, using an optical waveguide such as an optical fiber, or adjusting the gain of the light emission measuring device. An example of a light emission measuring device which has high sensitivity within a range from ultraviolet light to visible light is a photomultiplier tube PMT. In the case where the light emission intensity is high, a photodiode may be used in place of the photomultiplier tube PMT. In the case where the light emission intensity is higher, a neutral filter is used.

The discharge current waveform data obtained by the digital oscilloscope A at the time of creation of the database is input to a waveform analysis section A. The light emission waveform data obtained by the digital oscilloscope B at the time of creation of the database or at the time of evaluation of the discharge light emission of the measurement object is input to the waveform analysis section A and a waveform analysis section B. The electromagnetic wave (GHz band) detected through use of an antenna is input to the digital oscilloscope B as a trigger signal. The detected electromagnetic wave makes it possible to find the timing at which the lightning impulse power source starts the supply or application of current or voltage and perform the synchronous measurement while using the timing as a reference. Also, this makes it possible to find the timing in the lightning impulse waveform at which discharge or spark is generated.

The relation between the magnitude of discharge and the light intensity waveform data analyzed by the waveform-analysis section A is recorded in the database. Meanwhile, the light intensity waveform data analyzed by the waveform analysis section B at the time of evaluation of discharge light emission is input to a comparison section, embodied as a computer processor or computer PC as indicate below with regard to FIG. 9. Through use of the data recorded in the database, the comparison section evaluates the magnitude of discharge (the current peak value, the discharge charge amount, and the discharge energy) from the data of the measured light emission, and estimates their values.

Figure 4:
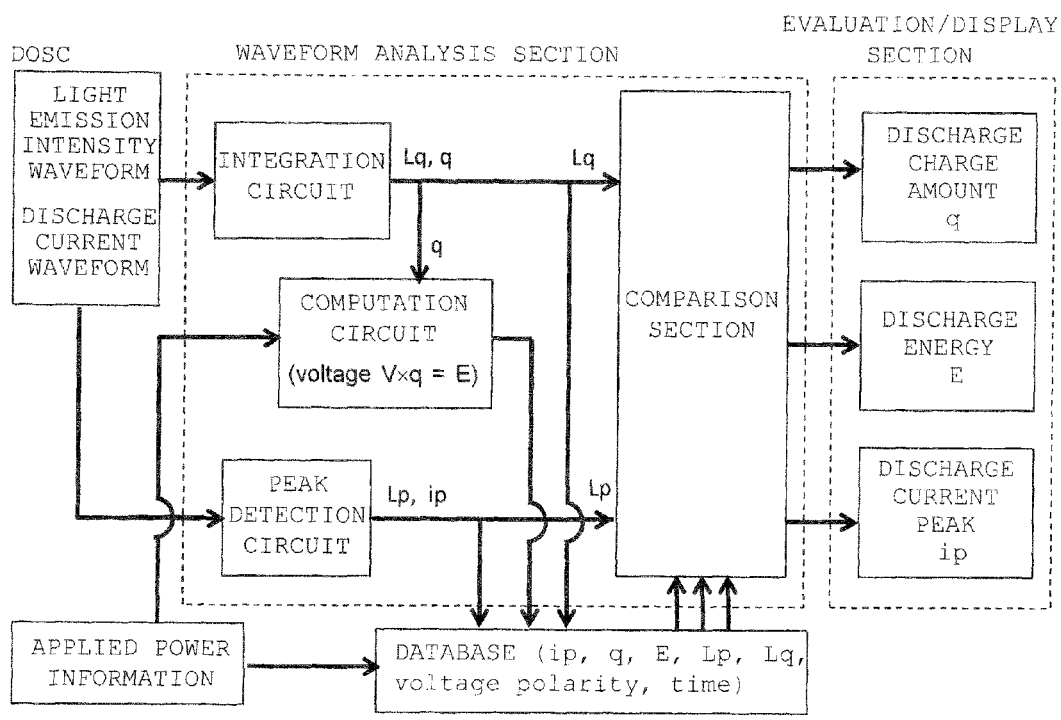
FIG. 4 is a diagram showing the details of a waveform analysis section, a database, a comparison section, and an evaluation/display section shown in FIG. 3.

FIG. 4 is a diagram showing the details of the waveform analysis section, the database, the comparison section, and the evaluation/display section shown in FIG. 3. The values of the discharge light emission intensity waveform and the discharge current waveform are led from a digital oscilloscope DOSC to an integration circuit and a peak detection circuit of the waveform analysis section. The integration circuit calculates the integral value Lq of the output waveform of the light emission measuring device and the integral value q of the output waveform of the current conversion probe CT or the current waveform detection device. The peak detection circuit calculates the peak value Lp of the output waveform of the light emission measuring device and the peak value ip of the output waveform of the current conversion probe CT or the current waveform detection device. Further, a computation circuit calculates the discharge energy E; i.e., the product of the output q from the integration circuit and and the voltage value V at the time when light emission has occurred, which voltage value is the applied power supply information. When the database is created, these values are recorded in the database.

When the discharge light, emission is evaluated, the peak value ip of the discharge current waveform, the discharge charge amount q which is the area (time-integral value) of the discharge current waveform, and the discharge energy E are evaluated on the basis of the peak value Lp or the integral value Lq of the output waveform of the light emission measuring device and the data recorded in the database. In particular, the peak value ip of the discharge current waveform is evaluated on the basis of the peak value Lp of the output waveform of the light emission measuring device, and the discharge charge amount q is evaluated on the basis of the integral value Lq of the output waveform of the light emission measuring device. Since a large different is not produced between the discharge energy E evaluated on the basis of the peak value Lp and the discharge energy E evaluated on the basis of the integral value Lq, either of the peak value Lp and the integral value Lq may be used for evaluation of the discharge energy E.

Figure 5A:
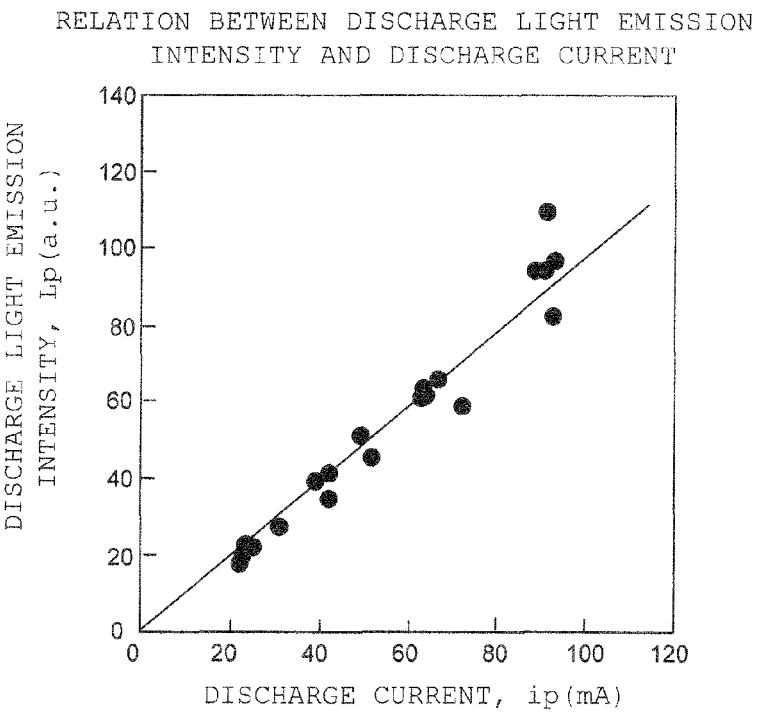
Figure 5B:
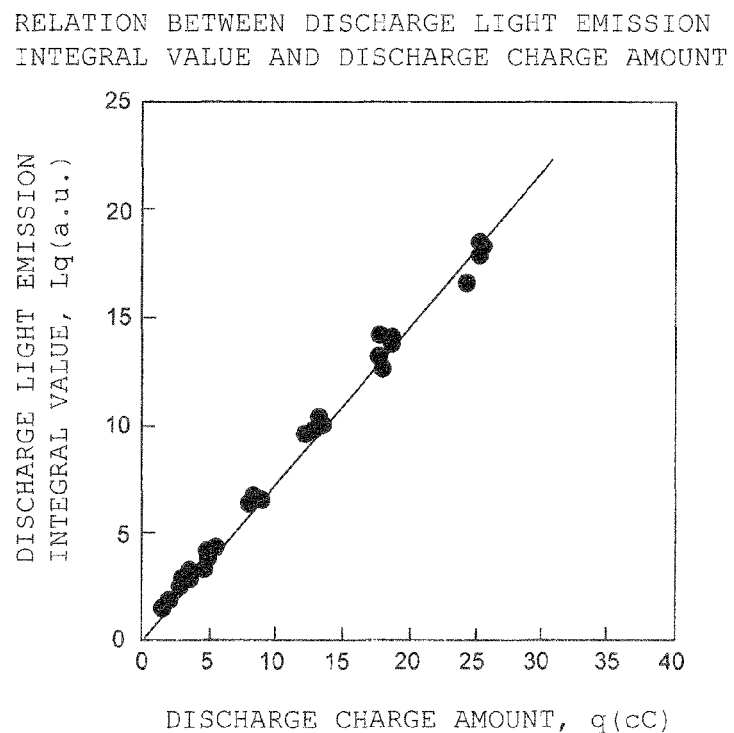

FIGS. 5(A) and 5(B) are a pair of graphs showing an example of the characteristic when an optical waveguide (optical fiber) is used wherein FIG. 5(A) shows the relation between discharge light emission intensity and discharge current, and FIG. 5(B) shows the relation between discharge light emission integral value and discharge charge amount. As shown in FIG. 5(A), linearity is observed between the discharge light, emission intensity Lp and the peak value ip of discharge current ip. Similarly, as shown in FIG. 5(B), linearity is also observed between the discharge light emission integral value Lq and the discharge charge amount q.

Figure 6:
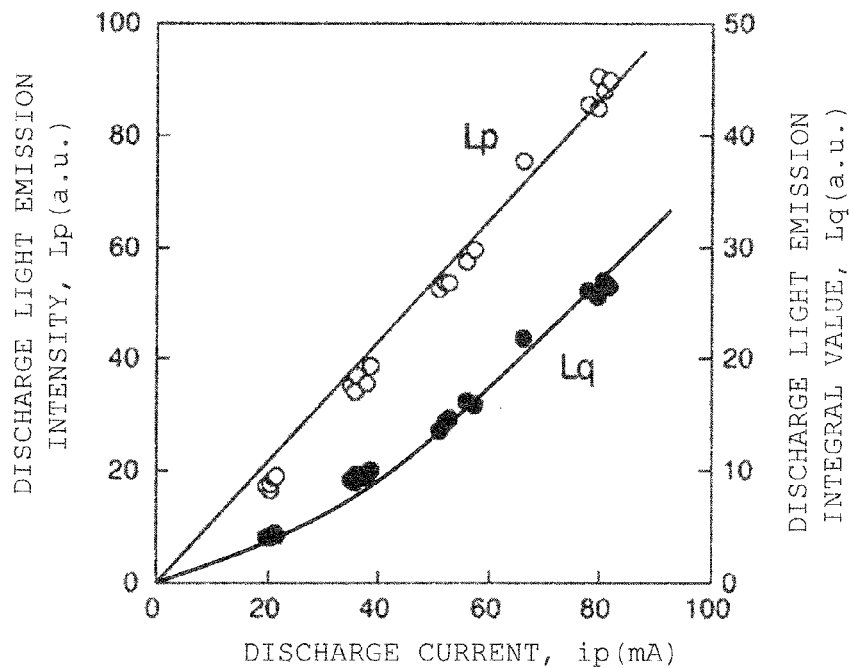
FIG. 6 is a graph used for explaining an operation of measuring light emission signals, such as the peak value Lp of light emission intensity waveform and the integral value Lq of light emission intensity, simultaneously with the peak value of discharge current and estimating the peak value ip of discharge current from this characteristic, Lp, and Lq.

FIG. 6 is a graph used for explaining an operation of measuring light emission signals, such as the peak value Lp of light emission intensity waveform and the integral value Lq of light emission intensity, simultaneously with the peak value of discharge current and estimating the peak value ip of discharge current from this characteristic, Lp, and Lq. In FIG. 6, plots shows actually measured values, and lines are approximate characteristic curves corrected for creation of the database. Points on each characteristic curve of this graph are stored in the database in the form of a table. For the peak value ip of the discharge current waveform, the peak value Lp of the output waveform changes more linearly than the integral value Lq thereof. From the physical viewpoint, use of the peak value Lp of the output waveform is preferred for estimation of the peak value ip of the discharge current waveform. Notably, in the case where the output peak value ip does not change linearly in proportion to the input peak value Lp or integral value Lq, an approximate characteristic curve representing the relation between the input peak value Lp or integral value Lq and the output peak value ip is expressed by a function, and the output peak value ip corresponding to the input value of the peak value Lp or integral value Lq is obtained through use of the function.

Figure 7:
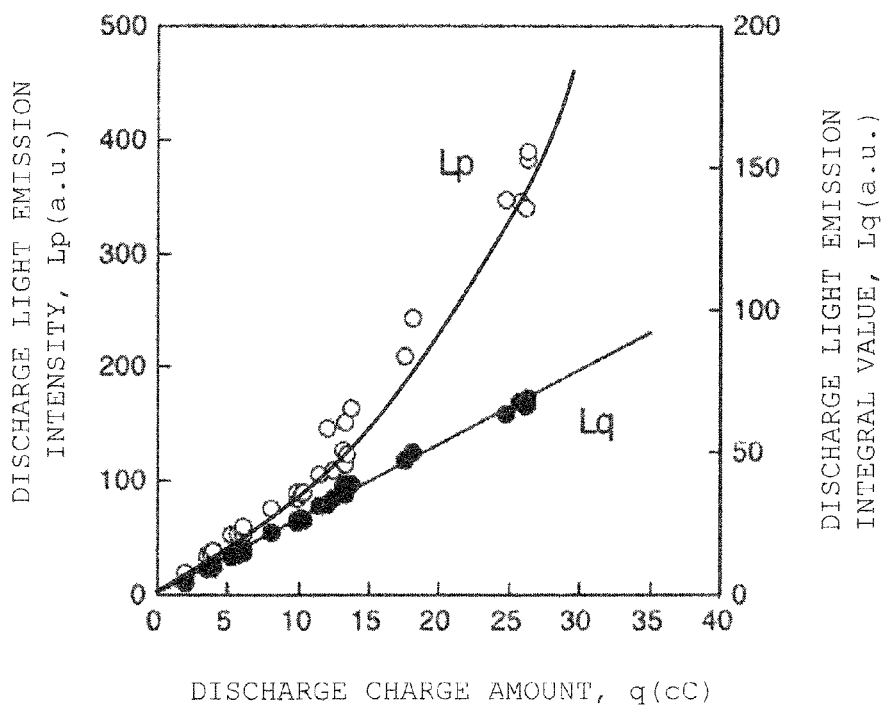
FIG. 7 is a graph used for explaining an operation of measuring light emission signals, such as the peak value Lp of light emission intensity waveform and the integral value Lq of light emission intensity, simultaneously with the amount of discharge charge and estimating the amount q discharge charge from this characteristic, the peak value Lp, and the integral value Lq as in the case of FIG. 6.

FIG. 7 is a graph used for explaining an operation of measuring light emission signals, such as the peak value Lp of light emission intensity waveform and the integral value Lq of light emission intensity, simultaneously with the discharge charge amount and estimating the discharge charge amount q from this characteristic, the peak value Lp, and the integral value Lq as in the case of FIG. 6. In FIG. 7, plots shows actually measured values, and lines are approximate characteristic curves corrected for creation of the database. Points on each characteristic curve of this graph are stored in the database in the form of a table. For the discharge charge amount q, the integral value Lq changes more linearly than the peak value Lp. From the physical viewpoint, use of the integral value Lq is preferred for estimation of the discharge charge amount q. Notably, in the case where the output discharge charge amount q does not change linearly in proportion to the input peak value Lp or integral value Lq, an approximate characteristic curve representing the relation between the input peak value Lp or integral value Lq and the output discharge charge amount q is expressed by a function, and the discharge charge amount q corresponding to the input value of the peak value Lp or integral value Lq is obtained through use of the function.

Figure 8:
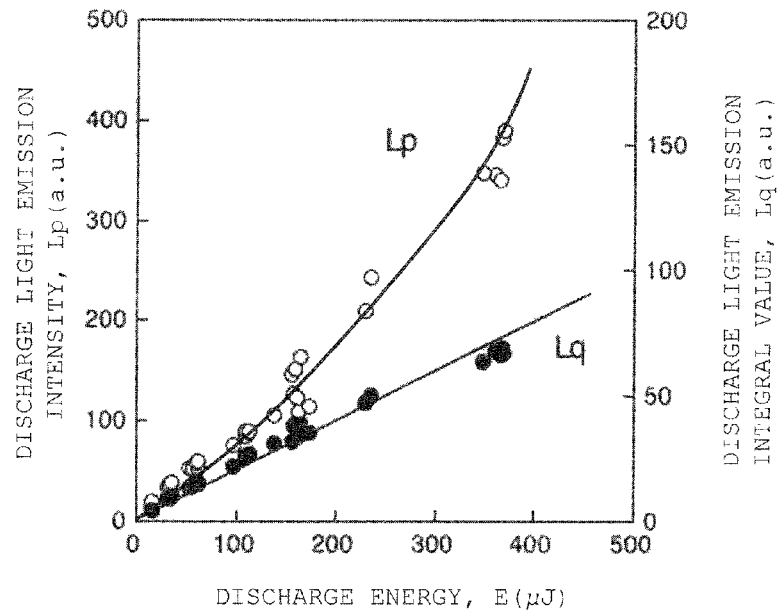
FIG. 8 is a graph used for explaining an operation of measuring light emission signals, such as the peak value Lp of light emission intensity waveform and the integral value Lq of light emission intensity, simultaneously with discharge energy and estimating the discharge energy E from this characteristic as in the case of FIGS. 6 and 7.

FIG. 8 is a graph used for explaining an operation of measuring light emission signals, such as the peak value Lp of light emission intensity waveform and the integral value Lq of light emission intensity, simultaneously with discharge energy and estimating the discharge energy E from this characteristic as in the case of FIGS. 6 and 7. In FIG. 8, plots shows actually measured values, and lines are approximate characteristic curves corrected for creation of the database. Points on each characteristic curve of this graph are stored in the database in the form of a table. For the discharge energy E, the integral value Lq changes more linearly than the peak value Lp. From the physical viewpoint, use of the integral value Lq is preferred for estimation of the discharge energy E. Notably, in the case where the output discharge energy E does not change linearly in proportion to the input peak value Lp or integral value Lq, an approximate characteristic curve representing the relation between the input peak value Lp or integral value Lq and the output discharge energy F is expressed by a function, and the discharge energy E corresponding to the input value of the peak value Lp or integral value Lq is obtained through use of the function.

Example 1

Figure 9:
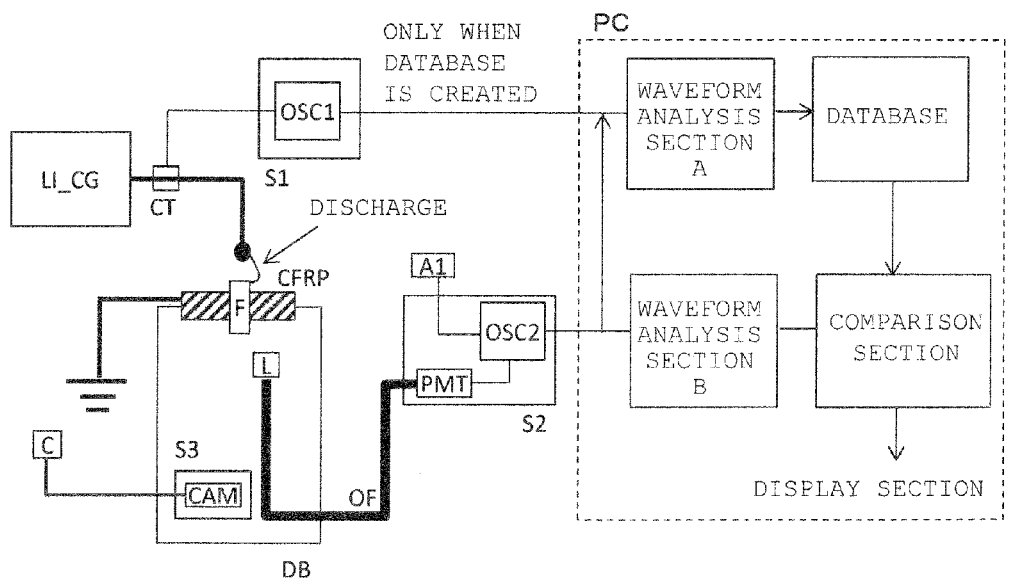
FIG. 9 is a schematic diagram showing an example in which the present invention is embodied as a lightning resistance test device.

FIG. 9 is a schematic diagram showing an example in which the present invention is embodied as a lightning resistance test device. In a lightning resistance test, a current source LI_CG which can supply a lightning impulse current and a current detector CT for detecting the impulse current are used as a power source. In the case of the impulse power source, its polarity is known. However, it is necessary to know the timing at which discharge or spark has been generated. The timing is measured through use of an antenna A1.

In order to measure light emission of a sample (sample with a fastener F) of CFRP, the sample is placed in a dark box CF. In the dark boxy DB, a digital camera CAM for capturing an image of emitted light and an optical fiber OF for guiding a light emission signal to a photomultiplier tube PMT are properly disposed. The digital camera CAM is placed in a shield box S3. The optical fiber OF extends from the dark boxy DB to a point within a different shield box S2. Notably, if necessary, the digital camera CAM and the optical fiber OF may be disposed on opposite sides (i.e., front and back sides) of the sample. A release operation section C is provided in order to open and close the shutter of the camera CAM from the outside of the dark box. Before a test, in order to prepare for photographing, the shutter is opened by the release operation section C. The image of emitted light is then photographed. When the interior of the dark boxy is observed after the photographing, the shutter is closed again so as to prevent the image of emitted light from disappearing due to external light.

A photomultiplier tube (PMT) or a photodiode is used so as to measure the light emission intensity waveform. A condenser lens (L) and an optical filter which allows light of a specific wavelength to pass therethrough may be attached to the forward end of the optical fiber OF. Since the distance between the sample and the forward end of the optical fiber OF or the photomultiplier tube (PMT) affects the intensity of the measured waveform, it is important to properly select the distance and record it. For this distance, a calibration curve is obtained under the same condition as the measurement condition such as the configuration of the light emission measuring device (presence/absence of the filter and the condenser lens). Within the shield box S2, the photomultiplier tube PMT (or a photodiode) is disposed to face the rear end of the optical fiber OF, and its output is supplied to a digital oscilloscope OSC2. Notably, the photomultiplier tube PMT and the digital oscilloscope OSC are driven by a battery or are powered by a power source which is disposed in the shield box and which is electrically insulated from the outside.

A signal output from an antenna A1 (e.g., a horn antenna) which is disposed externally of the shield box S2, has directivity, and has sensitivity in the GHz band is introduced into the shield be S2 through a coaxial cable. This signal serves as a trigger signal for the digital oscilloscope OSC2. The waveform of a test current supplied from the lighting impulse power source L1_CG to the sample (sample with a fastener F) of CFRP is observed by the digital oscilloscope OSC1 as the output of the current probe CT, and is obtained.

The observation and obtainment of the waveform of the applied lightning impulse current are performed by the first waveform observing device OSC1 disposed in the first shield box S1. Meanwhile, the observation and obtainment of the waveform of the light emission intensity are performed by the second waveform observing device OSC2 disposed in the second shield box S2. Since the observation and obtainment of the waveform of the applied lightning impulse current and the observation and obtainment of the waveform of the light emission intensity are performed by different waveform observing devices (OSC1 and OSC2) at different locations as described above, it is necessary to render the time axes of the two devices coincident with each other; namely, to perform synchronous measurement.

In order to realize the synchronous measurement, there is used the antenna (A1) which has directivity and sensitivity in the GHz band and which triggers the observation and obtainment, of the waveform of the light emission intensity performed through use of the second waveform observing device OSC2. Since an electromagnetic wave generated as a result of discharge is detected by the antenna (A1), it is possible to find the timing at which the supply of the lightning impulse current starts and to perform synchronous measurement while using that timing as a reference. Further, since such an electromagnetic wave is detected, it is possible to detect the timing (arc entry) at which a thin wire is fused and to observe, as an electromagnetic wave, discharge or spark generated during a test. As a result, it is possible to electromagnetically observe, the wire blowout and the phenomenon of discharge or spark occurring during the lightning resistance test and to check the timing at which the phenomenon of light emission measured by the PMT occurs.

For the system of measuring the light emission intensity waveform, there is used a dark box (DB) which allows the light emission intensity waveform measuring element (PMT) to measure weak discharge (spark) light emission with high sensitivity. Further, use of the camera (CAM) enables synchronous observation of the image of emitted light. The camera (CAM) and PMT are disposed in the shield box (S2, S3) together with the waveform measuring device (OSC2) in order that they are not influenced by strong electromagnetic noise generated as a result of supply of the lightning impulse current.

The lightning impulse current waveform obtained by the first waveform observing device OSC1 and the light emission. intensity waveform obtained by the second waveform observing device OSC2 are taken into a computer PC. In the computer PC, the operation having been described in detail with reference to FIGS. 3 and 4 is performed, especially the operations of the comparison section. Specifically, when the database is created, the discharge current waveform and the light emission intensity waveform are analyzed at the waveform analysis section A, and the obtained analysis data is recorded in the database. Meanwhile, when the discharge light emission is evaluated, the data of the light emission intensity waveform analyzed at the waveform analysis section B is compared with the data recorded in the database in order to evaluate the discharge light emission, and the result of the evaluation is displayed on a display section.

Since the dark box DB, the shield boxes, the photomultiplier tube PMT, the antenna, and the optical fiber are used as described above, it is possible to measure weak discharge or spark light emission in a poor electromagnetic noise environment, at the time when the lightning impulse current (several 10s of kA to 200 kA) is supplied, and to measure the weak discharge or spark light emission synchronism with the waveform of the current supply from the power source.

Figure 10:
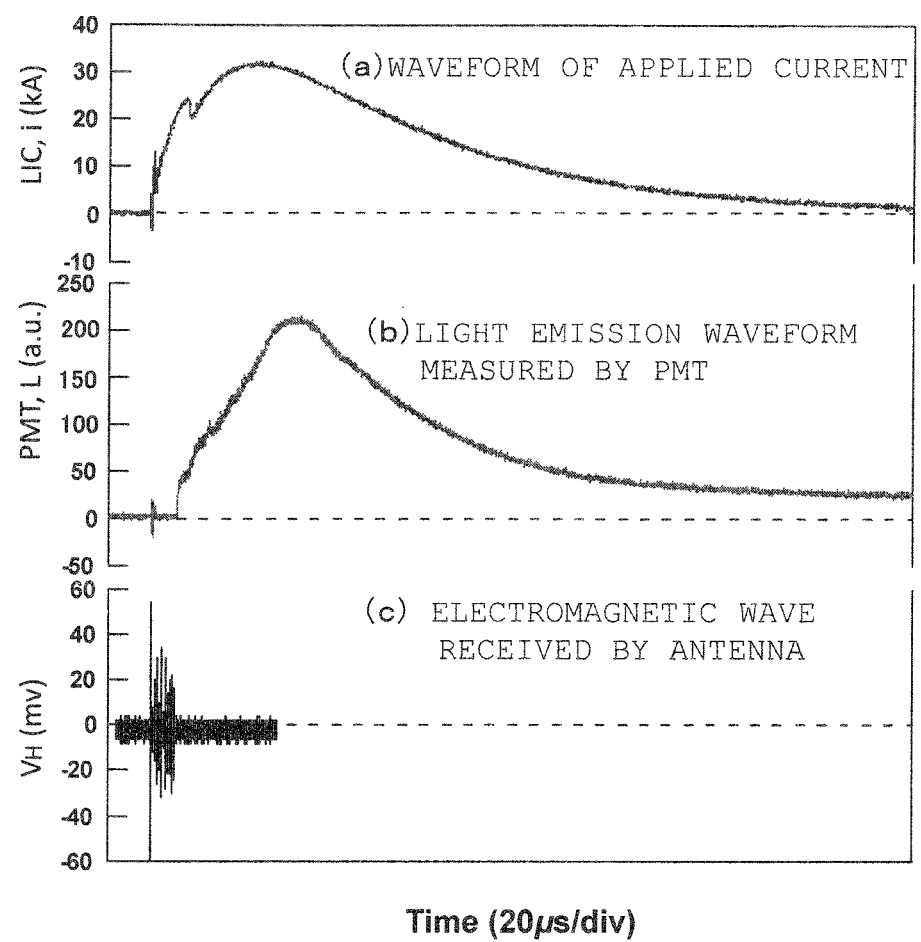
FIG. 10 is a set of graphs showing various waveforms observed in the lightning resistance test device shown in FIG. 9.

FIG. 10 is a set of graphs showing various waveforms observed in the lightning resistance test device shown in FIG. 9. The detected lightning impulse current waveform is shown in the upper section of the graph, the light emission waveform measured by the light emission measuring device PMT is shown in the central section of the graph, and, the electromagnetic wave received by the antenna A is shown in the lower section of the graph.

Figure 11:
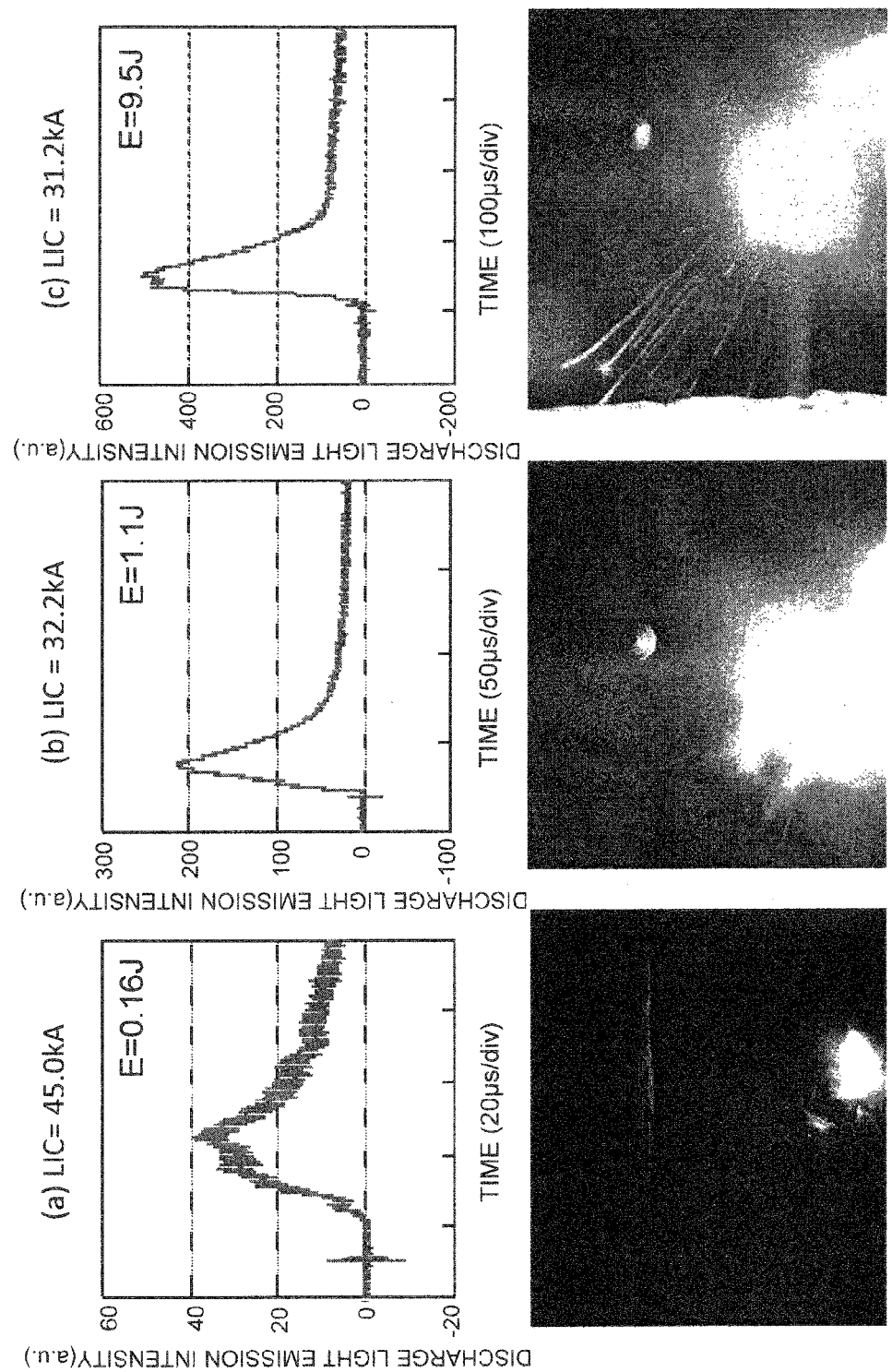
FIGS. 11(a) through 11(c) show photographs of images of emitted light and graphs of light emission intensity waveforms obtained by changing the value of lightning impulse current.

FIGS. 11(a) through 11(c) show photographs of images of emitted light, and graphs of light, emission intensity waveforms obtained by changing the value of the lightning impulse current. The letter "E" in the graphs represents the discharge energy derived from the light emission intensity waveform. The current value LTC represents the peak value of the applied current waveform. Since the intensity of emitted light changes depending on the timing in the lightning impulse current waveform at which discharge or spark is generated, the intensity of emitted light does not relate directly to the current value LTC which represents the peak value. The graphs reveal that the larger the photographed image of emitted light and the higher the brightness of the image, the larger the evaluated discharge energy. The graphs also reveal the range of discharge energy within the test was able to be carried out.

Although only some exemplary embodiments of this invention have been described in detail above, many modifications are possible in the exemplary embodiments without materially departing from the novel teachings and advantages of this invention.

The invention claimed is:

1. A non-contact discharge test method of evaluating, in a non-contact manner, the magnitude of discharge or spark of a measurement object on the basis of optical light emission data obtained by optically measuring a light emission phenomenon occurring as a result of the discharge or spark, the method comprising:

creating a database by applying a voltage or current from a known power source to the measurement object such that light emission of discharge or spark occurs, measuring an area of a light intensity waveform which is an integral value of the discharge light emission intensity through use of a light emission measuring device and simultaneously measuring area of a current waveform of the discharge or spark which is an integral value of a discharge current value through use of a current measuring device, and storing the relation between analysis data sets obtained through analysis of the intensity waveform of the light emission and the current waveform of the discharge or spark in the database on the basis of applied power supply information which is information of the voltage or current applied to the measurement object;

detecting an electromagnetic wave generated as a result of the discharge or spark of the measurement object, and measuring the intensity waveform of the light emission of the discharge or spark generated from the measurement object by using the light emission measuring device or a second light emission measuring device, wherein the second light emission measuring device is identical to the light emission measuring device, while using the electromagnetic wave as a timing reference for the generation of the discharge or spark; and comparing light emission data obtained through analysis of the measured intensity waveform of the light emission of the discharge or spark with the data recorded in the database to thereby estimate the magnitude of the discharge or spark as a value.

2. A non-contact discharge test method according to claim 1, further comprising: disposing each of the light emission measuring device and the current measuring device in a shield box.

3. A non-contact discharge test method according to claim 1, further comprising using the method in a lightning resistance test, wherein the test comprises using an impulse power source as the known power source causing the light emission of the discharge or spark, and using a current detector or a voltage detector to detect the applied power supply information.

4. A non-contact discharge test method according to claim 1, wherein the magnitude of the discharge or spark is a charge amount which is an integral value of the current of the discharge or spark, or the energy of the discharge or spark.

5. A non-contact discharge test device for evaluating, in a non-contact manner, the magnitude of discharge or spark of a measurement object on the basis of optical light emission data obtained by optically measuring a light emission phenomenon occurring as a result of the discharge or spark, the device comprising:

a shielded light emission measuring device for measuring an area of a light intensity waveform which is an integral value of the discharge light emission intensity by applying a voltage or current from a known power source to the measurement object such that light emission of discharge or spark occurs;

a shielded current measuring device for measuring an area of a current waveform of the discharge or spark;

a database in which the relation between analysis data sets obtained through analysis of the intensity waveform of the light emission and the current waveform of the discharge or spark is recorded on the basis of applied power supply information which is information of the voltage or current applied to the measurement object;

an antenna for detecting an electromagnetic wave generated as a result of the discharge or spark of the measurement object;

a waveform intensity obtaining device for measuring the intensity waveform of the light emission of the discharge or spark generated from the measurement object and obtaining the waveform intensity of the intensity waveform, which is measured by using the light emission measuring device or a second light emission measuring device, wherein the second light emission measuring device is identical to the light emission measuring device, while using the electromagnetic wave as a timing reference for the generation of the discharge or spark;

a waveform analyzing section for analyzing the waveform intensity obtained by the waveform intensity obtaining device;

a comparison section for comparing light emission data obtained as a result of the analysis by the waveform analyzing section with the data recorded in the database to thereby estimate the magnitude of the discharge or spark as a value; and a display section for displaying the estimated magnitude of the discharge or spark.

6. A non-contact discharge test device according to claim 5, wherein an impulse power source is used as the known power source so as to cause the light emission of the discharge or spark for performing a lightning resistance test, and the applied power supply information is detected through use of a current detector or a voltage detector.

7. A non-contact discharge test device according to claim 5, wherein the magnitude of the discharge or spark is a charge amount which is an integral value of the current of the discharge or spark, or the energy of the discharge or spark.

8. A non-contact discharge test device according to claim 5, wherein the light emission measuring device is disposed to face the measurement object through an optical guide.

9. A method of evaluating a magnitude of an electrical discharge, the method comprising the steps of:

creating a plurality of different reference electrical discharges to create a database;

measuring a light intensity waveform of each of the plurality of reference electrical discharges;

determining an integral of the light intensity waveform for each of the plurality of reference electrical discharges;

measuring a current intensity waveform of each of the plurality of reference electrical discharges;

determining an integral of the current intensity waveform for each of the plurality of reference electrical discharges;

storing a relationship of the light intensity waveform, the current intensity waveform, the integral of the light intensity waveform and the integral of the current intensity waveform in the database for each of the plurality of reference electrical discharges;

performing a test electrical discharge;

measuring a light intensity waveform of the test electrical discharge;

determining an integral of the light intensity waveform for the test electrical discharge;

estimating a magnitude of the test electrical discharge using the integral of the light intensity waveform for the test electrical discharge and the relationships stored in the database.

10. A method in accordance with claim 9, wherein:
the estimated magnitude of the test electrical discharge is an integral value of the current of the test electrical discharge.

11. A method in accordance with claim 9, wherein:
the estimated magnitude of the test electrical discharge is an energy of the test electrical discharge.

12. A method in accordance with claim 9, further comprising the steps of:

determining an energy of each of the plurality of reference electrical discharges;

storing a relationship of the energy of the plurality of reference electrical discharges to the light intensity waveform, to the current intensity waveform, to the integral of the light intensity waveform and to the integral of the current intensity waveform in the database for each of the plurality of reference electrical discharges;

the estimated magnitude of the test electrical discharge is an energy of the test electrical discharge.

* * * * *